United States Patent
Cho et al.

(10) Patent No.: US 8,445,991 B2
(45) Date of Patent: May 21, 2013

(54) SEMICONDUCTOR DEVICE WITH MIM CAPACITOR AND METHOD FOR MANUFACTURING THE SAME

(75) Inventors: Jin-Youn Cho, Gunpo (KR); Young-soo Kang, Cheongju (KR); Sang-Geun Koo, Cheongju (KR)

(73) Assignee: Magnachip Semiconductor, Ltd., Cheongju (KR)

( * ) Notice: Subject to any disclaimer, the term of this patent is extended or adjusted under 35 U.S.C. 154(b) by 78 days.

(21) Appl. No.: 12/985,812

(22) Filed: Jan. 6, 2011

(65) Prior Publication Data
US 2011/0108951 A1    May 12, 2011

Related U.S. Application Data

(63) Continuation-in-part of application No. 12/603,124, filed on Oct. 21, 2009, now Pat. No. 8,159,046.

(30) Foreign Application Priority Data

Dec. 24, 2008  (KR) .................. 10-2008-0133890
Jul. 16, 2010   (KR) .................. 10-2010-0069232

(51) Int. Cl.
*H01L 29/92* (2006.01)

(52) U.S. Cl.
USPC .... 257/532; 257/533; 257/534; 257/E29.342; 257/E21.008; 438/381; 438/393

(58) Field of Classification Search
USPC .......... 257/532, 533, 534, E29.342, E21.008; 438/381, 393
See application file for complete search history.

(56) References Cited

U.S. PATENT DOCUMENTS

| 6,344,964 B1 | 2/2002 | Adler |
| 6,461,941 B2 | 10/2002 | Roberts et al. |
| 6,657,247 B2 * | 12/2003 | Yoshiyama et al. .......... 257/303 |
| 7,301,752 B2 | 11/2007 | Coolbaugh et al. |
| 7,582,901 B2 * | 9/2009 | Takeda et al. .................... 257/68 |
| 8,119,210 B2 * | 2/2012 | Narwankar et al. ........... 427/569 |
| 2002/0179951 A1 | 12/2002 | Yoshiyama et al. |
| 2003/0008467 A1 * | 1/2003 | Kai et al. ...................... 438/393 |
| 2004/0169211 A1 | 9/2004 | Zhuang et al. |
| 2009/0294905 A1 * | 12/2009 | Watanabe ...................... 257/532 |

FOREIGN PATENT DOCUMENTS

| JP | 2002-353328 | 12/2002 |
| KR | 10-2004-0045695 A | 6/2004 |

(Continued)

OTHER PUBLICATIONS

Korean Office Action issued on Aug. 26, 2011, in counterpart Korean Patent Application No. 10-2010-0069232 (8 pages).
Korean Office Action issued on Aug. 19, 2010, in corresponding Korean Application No. 10-2008-0133890 (6 pages).

(Continued)

*Primary Examiner* — Thinh T Nguyen
(74) *Attorney, Agent, or Firm* — NSIP Law

(57) ABSTRACT

A semiconductor device and a method of manufacturing the semiconductor device are provided. The semiconductor device includes a lower electrode formed on a substrate, a dielectric layer including an etched dielectric region and an as-grown dielectric region formed on the lower electrode, an upper electrode formed on the as-grown dielectric region, a hardmask formed on the upper electrode, a spacer formed at a side surface of the hardmask and the upper electrode and over a surface of the etched dielectric region, and a buffer insulation layer formed on the hardmask and the spacer.

16 Claims, 6 Drawing Sheets

FOREIGN PATENT DOCUMENTS

| | | |
|---|---|---|
| KR | 10-2005-0079433 A | 8/2005 |
| KR | 10-2006-0114056 A | 11/2006 |
| KR | 10-2007-0028392 A | 3/2007 |
| KR | 10-2007-0098318 | 10/2007 |
| KR | 10-2010-0075248 A | 7/2010 |

OTHER PUBLICATIONS

Extended European Search Report issued on Nov. 18, 2010 in European Patent Application No. 09252370.3 filed on Oct. 7, 2009, which corresponds to pending U.S. Appl. No. 12/603,124 (8 pages).

* cited by examiner

SEMICONDUCTOR DEVICE WITH MIM CAPACITOR AND METHOD FOR MANUFACTURING THE SAME

CROSS-REFERENCE TO RELATED APPLICATIONS

This application is a continuation-in-part application of U.S. patent application Ser. No. 12/603,124, filed on Oct. 21, 2009, now U.S. Pat. No. 8,159,046, issued on Apr. 17, 2012, which claims the priority of Korean Patent Application Nos. 10-2008-0133890, filed on Dec. 24, 2008, and 10-2010-0069232, filed on Jul. 16, 2010, in the Korean Intellectual Property Office, the disclosures of which are incorporated herein by reference.

FIELD

The following description relates to a semiconductor device and a method for manufacturing the same, and more particularly, to a metal-insulator-metal (MIM) capacitor having a high-dielectric constant and a method for manufacturing the same.

DESCRIPTION OF RELATED ART

In general, a semiconductor device is required to be operated at high speed while having a high storage capacity in the functional aspect.

For this purpose, technologies of fabricating a semiconductor device have been developed to improve a degree of integration, response speed and reliability. In order to enhance a refresh characteristic of a semiconductor device, an electrostatic capacity value of a constituent element such as a capacitor included in the semiconductor device should be high.

However, in recent years, as the semiconductor device becomes highly integrated, a unit cell area continues to decrease. Accordingly, a cell electrostatic capacitance of the semiconductor device also decreases, making it difficult to secure an electrostatic capacity required for device operation.

In general, the electrostatic capacitance of a capacitor is increased through increasing an area of an opposite electrode, increasing a relative dielectric constant of a dielectric substance between electrodes, and reducing a thickness of a dielectric substance. Thus, a structure of the capacitor is diversified while reducing the thickness of the dielectric substance to obtain a suitable electrostatic capacity.

On the other hand, studies for applying materials having a high-dielectric constant, instead of a silicon nitride dielectric layer that has been used thus far to obtain the suitable electrostatic capacity, have been carried out. Materials having the high-dielectric constant include hafnium oxide, aluminum oxide, and tantalum oxide However, when a high-dielectric-constant (high-k) material is used as an insulation layer of the MIM capacitor, its subsequent process will be affected due to the insulation layer remaining subsequent to etching an upper electrode of the MIM capacitor.

Furthermore, the profile of metal wiring is deteriorated due to an insufficient photoresist (PR) margin, a creation of a metal polymer by the remaining high-dielectric-constant insulation layer, and remains of metal polymer inside a hole in a subsequent via etching process. Due to such problems, a via resistance is increased, thereby reducing a reliability of a capacitor.

In addition, if a subsequent via over-etch target is increased to remove the remaining insulation layer, a breakdown voltage characteristic deterioration is generated.

SUMMARY

General aspects are directed to a metal-insulator-metal (MIM) capacitor and a method configured to fabricate the MIM capacitor, in which reliability is enhanced, an effect on the subsequent process is minimized, and breakdown voltage deterioration due to the via over-etch target is prevented by isolating the MIM capacitor from an external environment.

In one general aspect, there is provided a semiconductor device, including a lower electrode formed on a substrate, a dielectric layer including an etched dielectric region and an as-grown dielectric region formed on the lower electrode, an upper electrode formed on the as-grown dielectric region, a hardmask formed on the upper electrode, a spacer formed at a side surface of the hardmask and the upper electrode and over the etched dielectric region, and a buffer insulation layer formed on the hardmask and the spacer.

The device may further provide that the dielectric layer includes atomic laser deposition (ALD) high-k $HfO_2/Al_2O_3$ film stacks.

The device may further provide that the hardmask and the upper electrode are patterned using a same mask to have a same shape.

The device may further provide that the spacer isolates the side surface of the hardmask and the upper electrode.

The device may further provide that the as-grown dielectric region separates the lower electrode from the upper electrode.

The device may further provide that a length of the lower electrode is greater than a length of the upper electrode.

The device may further provide that the lower electrode includes TiN/Ti, and the upper electrode includes TiN.

The device may further provide that the etched dielectric region extends from the as-grown dielectric region and terminates approximately at an end of the spacer, the end of the spacer being formed on an opposite side of the spacer from a side of the spacer contacting the side surface of the hardmask and the upper electrode, and a thickness of the etched dielectric region is less than a thickness of the as-grown dielectric region.

The device may further provide that the end of the spacer is defined by the buffer insulation layer and the etched dielectric region.

The device may further provide a curved dielectric region formed between the as-grown dielectric region and the etched dielectric region.

The device may further provide that the spacer is formed over the curved dielectric region.

The device may further provide that the etched dielectric region extends from the curved dielectric region and terminates approximately at an end of the spacer, the end of the spacer being formed on an opposite side of the spacer from a side of the spacer contacting the side surface of the hardmask and the upper electrode, the curved dielectric region is configured to connect the etched dielectric region and the as-grown dielectric region, and a thickness of the etched dielectric region is less than a thickness of the as-grown dielectric region and the curved dielectric region.

The device may further provide that the buffer insulation layer includes SiON.

In another aspect, there is provided a method of manufacturing a semiconductor device. The method includes forming a first metal layer on a substrate, sequentially laminating a dielectric layer, a second metal layer, and a hardmask insulator on the first metal layer, selectively patterning the hardmask insulator, the second metal layer, and the dielectric layer to form a hardmask, an upper electrode, and a dielectric layer pattern having an etched dielectric region and an as-grown dielectric region, forming a spacer insulation layer on upper and side surfaces of the hardmask, a side surface of the upper electrode, and the etched dielectric region of the dielectric layer pattern, etching the spacer insulation layer to form a spacer at the side surface of the hardmask, the side surface of the upper electrode, and the etched dielectric region of the dielectric layer, forming a buffer insulation layer on the spacer, the hardmask, and the first metal layer, and patterning the buffer insulation layer and the first metal layer to form a lower electrode.

The method may further provide that the selectively patterning of the hardmask insulator and the second metal layer includes simultaneously etching a part of a thickness in the etched dielectric region under the second metal layer.

The method may further provide that the simultaneously etching of the part includes forming a curved dielectric region between the as-grown dielectric region and the etched dielectric region.

The method may further provide that a lower surface of the spacer contacts the etched dielectric region, a side surface of the spacer contacts the hardmask and the upper electrode, and curved surfaces of the spacer respectively contact the buffer insulation layer and the curved dielectric region.

The method may further provide that a lower surface of the spacer contacts the etched dielectric region, and a side surface of the spacer contacts the hardmask and the upper electrode.

The method may further provide that a thickness of the etched dielectric region is less than a thickness of the as-grown dielectric region.

The method may further provide that the buffer insulation layer includes SiON.

General aspects may provide an MIM capacitor that is isolated from an external environment and protected from various defects, thereby securing a good leakage current characteristic.

In addition, general aspects may provide that SiON deposited on an upper portion of the metal layer buffers an etch target during etching, thereby preventing the breakdown voltage characteristic deterioration of an MIM capacitor.

As a result, when using a process of fabricating an MIM capacitor according to general aspects, it may be possible to have an excellent characteristic in the reliability aspect such as breakdown voltage, defect density and the like.

Other features and aspects may be apparent from the following detailed description, the drawings, and the claims.

Figure 1A:
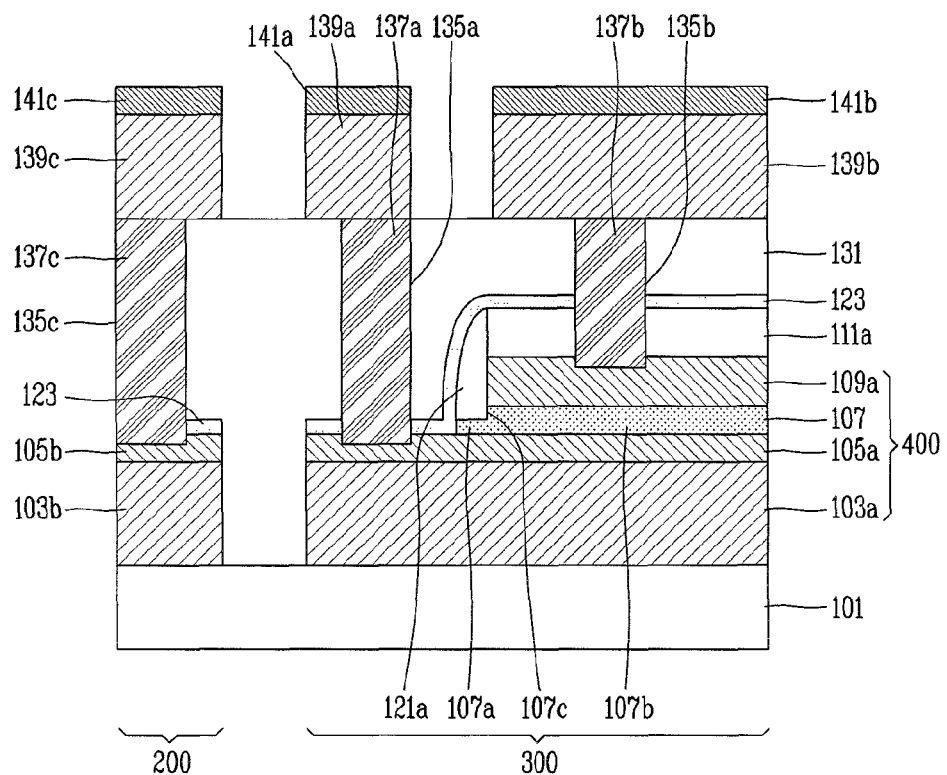
FIG. 1A illustrates a schematic cross-sectional view of an example of a semiconductor device including an interconnection region and an MIM capacitor region.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is understood that the features of the present disclosure may be embodied in different forms and should not be constructed as limited to example embodiment(s) set forth herein. Rather, embodiment(s) are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

Hereinafter, an example of a structure of a semiconductor device with MIM capacitor is described in detail with reference to the accompanying drawings.

FIG. 1A illustrates a schematic cross-sectional view of an example of a semiconductor device including an interconnection region 200 and an MIM capacitor region 300. In an interconnection region 200, a lower interconnection layer may be formed of a lower interconnection metal layer 103b and a lower interconnection capping layer 105b. Above the lower interconnection layer, an upper interconnection layer may be provided with an intermetal insulation layer 131 disposed there between. The upper interconnection layer may be formed of an upper interconnection metal layer 139c and an upper interconnection capping layer 141c. The upper interconnection layer may be electrically connected to the lower interconnection layer by a metal plug 137c.

Referring to FIG. 1A, an example of an MIM capacitor 400 in the MIM capacitor region 300 includes a metal wiring 103a, a lower electrode 105a on the metal wiring 103a, a dielectric layer 107, and an upper electrode 109a. The metal wiring 103a may be made of a same material and formed in a same manufacturing step as that of the lower interconnection metal layer 103b. The lower electrode 105a may be made of a same material and formed in a same manufacturing step as that of the lower interconnection capping layer 105b.

The metal wiring 103a may be composed of aluminum (Al), copper (Cu), or a combination of Al and Cu. In one general aspect, the metal wiring 103a may be composed of AlCu. The lower electrode 105a may be formed by using a metal, an alloy, or a conductive metal compound. In one general aspect, the lower electrode 105a may be composed of a TiN (top)/Ti (bottom) layer. A Ti layer may be needed to improve adhesion between TiN and AlCu.

The dielectric layer 107 may be formed for increasing a capacitance of the MIM capacitor 400. In one general aspect, the dielectric layer 107 may be composed of any one of insulation materials including silicon nitride (SiN), tantalum oxide ($Ta_2O_5$), hafnium oxide ($HfO_2$), aluminum oxide ($Al_2O_3$), and the like. In another general aspect, the dielectric layer 107 may be formed with a stacked structure such as $HfO_2/Al_2O_3$ layers and vice versa. In still another general aspect, the dielectric layer 107 may be formed with a repeated structure of high-k $HfO_2/Al_2O_3$ film stacks. Further, the $HfO_2$ layer may be effective in reducing leakage current. In one general aspect, a repeated structure of atomic layer deposition (ALD) high-k $HfO_2/Al_2O_3$ film stacks may be used to show a capacitance density between 4 $fF/\mu m^2$ and 12 $fF/\mu m^2$.

The upper electrode 109a may be formed by using a metal, an alloy, or a conductive metal compound. In one general aspect, the upper electrode 109a may be composed of a TiN layer. The lower electrode 105a may be composed of TiN (top)/Ti (bottom) layer. Therefore, the upper electrode 109a may include a material that is different from a material of the lower electrode 105a.

As previously mentioned, the Ti layer of the lower electrode 105a may serve as an adhesion layer to improve adhesion between the lower electrode and an AlCu layer of the metal wiring 103a. However, the upper electrode 109a does not need to use a Ti layer under the TiN layer, because the dielectric layer 107 is directly below the upper electrode 109a. No Ti adhesion layer is needed between the upper electrode 109a and dielectric layer 107.

Furthermore, the hardmask 111a may be formed on the upper surface of the upper electrode 109a to obtain a sufficient height of a sidewall spacer that is formed at a side of the upper electrode 109a. The height of only the upper electrode 109a may be too small to define a sidewall spacer at the side of the upper electrode 109a. Therefore, the hardmask 111a may be needed to make the sidewall spacer be formed at the side of the hardmask 111a and the upper electrode 109a.

In addition, the hardmask 111a reduces polymer generation during the etching of the TiN layer of the upper electrode 109a. If a photoresist pattern is used as a mask instead of hardmask, a significant amount of polymer is generated on the sidewalls of the upper electrode 109a and an upper surface of an over-etched portion of the dielectric layer 107. The generated polymer may behave like an electrode because it contains metallic components that have been transferred from the upper electrode 109a. The over-etched portion of the dielectric layer 107 is thinner than the as-grown portion of the dielectric layer 107. Therefore, the leakage current occurs from the metallic polymer to the thinned portion of the dielectric layer 107, thereby degrading a reliability of an MIM capacitor. However, an etching process with the hardmask 111a may prohibit polymer generation on the sidewalls of the upper electrode 109a, and prevent the above-mentioned problem from occurring.

The hardmask 111a may be formed with a single-layer structure made of an oxide layer. For example, the hardmask 111a may be composed of a silicon oxide-based material such as borophosphosilicate glass (BPSG), phosphosilicate glass (PSG), undoped silicate glass (USG), silicon-on-glass (SOG), field oxide (FOX), tetraethyl orthosilicate (TEOS), plasma TEOS (PE-TEOS), high density plasma oxides from chemical vapor deposition (HDP-CVD), and the like, or a nitride-based material such as SiN and silicon oxynitride (SiON). The hardmask 111a may have a multi-layer structure including at least one oxide layer, at least one nitride layer, and/or at least one oxynitride layer. In one general aspect, the oxide layer, and oxynitride layer may be formed by using SiN, SiN, and SiON, respectively. A thickness of the hardmask 111a may be in a range of about 100 Å to 4000 Å.

Moreover, the spacer 121a may be formed with a single-layer structure made of an oxide layer. For example, the spacer 121a may be composed of a silicon oxide-based material such as BPSG, PSG, USG, SOG, FOX, TEOS, PE-TEOS, HDP-CVD oxides, and the like, or a nitride-based material such as SiN and SiON. The material of the spacer 121a may be silicon oxide rather than silicon nitride, because silicon nitride may be more likely to induce unwanted fringing capacitance between the upper electrode 109a and the lower electrode 105a than silicon oxide.

A buffer insulation layer 123 may exist in both the interconnection region 200 and the MIM capacitor region 300. The buffer insulation layer 123 may cover the upper surface of the hardmask 111a, a side surface of the spacer 121a, and an exposed surface of the lower electrode 105a. The buffer insulation layer 123 does not contact the upper electrode 109a, because the upper electrode 109a is enclosed by the spacer 121a and the hard mask 111a. The buffer insulation layer 123 may be composed of a silicon oxide layer containing nitrogen atoms, i.e., silicon oxynitride (SiON). Thus, the buffer insulation layer 123 may perform the role of an antireflection layer configured to increase a margin of a lithography process during a subsequent metal patterning.

Furthermore, the buffer insulation layer 123 may simultaneously perform the role of a buffer layer configured to buffer a via etch target. In addition, the buffer insulation layer 123 may also be used as an hardmask configured to etch the metal wiring layer 103 and the first metal layer 105 (illustrated in FIGS. 2A through 2E). For etching the metal wiring layer 103 and the first metal layer 105, photoresist (PR) is used as a mask. However, a PR mask is not enough to etch the metal wiring layer 103 and the first metal layer 105. In one general aspect, the thickness of the buffer insulation layer 123 may be in a range of 100 Å to 500 Å. On the other hand, the buffer insulation layer 123 may be formed by using organic BARC instead of inorganic SiON.

Moreover, an intermetal insulation layer 131 may be formed over the buffer insulation layer 123. A first and a second pad 139a, 139b and a first and a second antireflection layer 141a, 141b may be formed over the intermetal insulation layer 131. The first and second pads 139a, 139b may be electrically connected to the lower electrode 105a and the upper electrode 109a through a first and a second plug 137a, 137b, respectively. The first and the second plug 137a, 137b may include tungsten (W), copper, and the like. In one general aspect, the first and the second plug 137a, 137b may include tungsten (W). In addition, a pre-metal insulation layer (not shown) may be interposed between the substrate 101 and the metal wiring 103a.

Figure 1B:
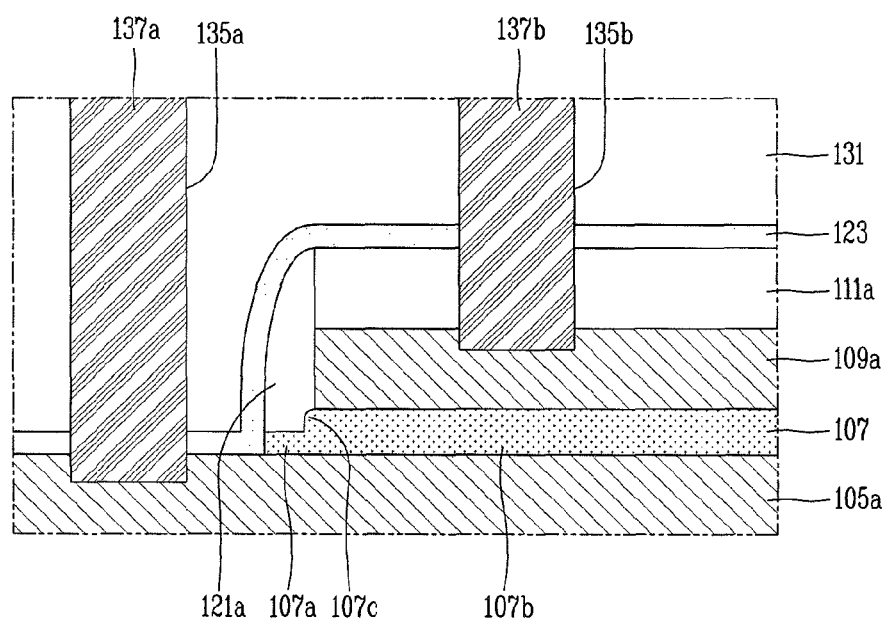
FIG. 1B illustrates an enlarged schematic cross-sectional view of an example of a neighborhood of a dielectric layer 107 of FIG. 1A.

FIG. 1B illustrates an enlarged schematic cross-sectional view of an example of a neighborhood of a dielectric layer 107 of FIG. 1A. The dielectric layer 107 may be divided into three regions. A first region may be an etched dielectric region 107a having an etched thickness being less than an as-grown thickness of an as-grown dielectric region 107b. The etched dielectric region 107a may extend from the as-grown dielectric region 107b. A curved (or stepped) dielectric region 107c may be at an adjacent portion between the etched dielectric region 107a and the as-grown dielectric region 107b.

The thickness of the etched dielectric region 107a may be less than the thickness of the as-grown dielectric region 107b, thereby increasing a capacitance. That is, since the thickness of etched dielectric region 107a is decreased, capacitance is increased. Accordingly, this effect may be obtained for the existence of the etched dielectric region 107a.

The curved dielectric region 107c may be implemented because the upper electrode 109a and the hardmask 111a are different from each other. The spacer 121a may be formed in the MIM capacitor 400 in order to decrease leakage current between the upper electrode 109a and the lower electrode 105a. The spacer 121a may cover the hardmask 111a, the side surface of the upper electrode 109a, and an exposed surface of the dielectric layer 107. In one general aspect, the exposed surface of the dielectric layer 107 may include surfaces of the etched dielectric region 107a and the curved dielectric region 107c.

A horizontal length (or width) of the lower electrode 105a may be greater than a horizontal length (or width) of the upper electrode 109a. The upper electrode 109a may be well separated from the lower electrode 105a by forming the dielectric layer 107, thereby helping to suppress the generation of leakage current. If the lower electrode 105a and upper electrode 109a have the same width, the leakage current is likely generated by an electric field along the side surface thereof. On the contrary, if the width of the lower electrode 105a is greater than the width of the upper electrode 109a as described above, it may be possible to prevent such a problem.

As described above, the MIM capacitor 400 may be isolated from an external environment and protected from various defects using the spacer 121a and the hardmask 111a, thereby obtaining a good leakage current characteristic.

A method of manufacturing an MIM capacitor according to general aspects will be described with reference to FIGS. 2A through 2I.

FIGS. 2A through 2I illustrate cross-sectional views of an example of fabricating an MIM capacitor.

Though not shown in the drawings, first, a lower structure (not shown) may be formed on the substrate 101, and a premetal dielectric layer (not shown) may be deposited on the lower structure. The lower structure, though not shown in the drawing, may include a pad, a conductive pattern, a wiring, a gate structure, a transistor, and the like.

Figure 2A:
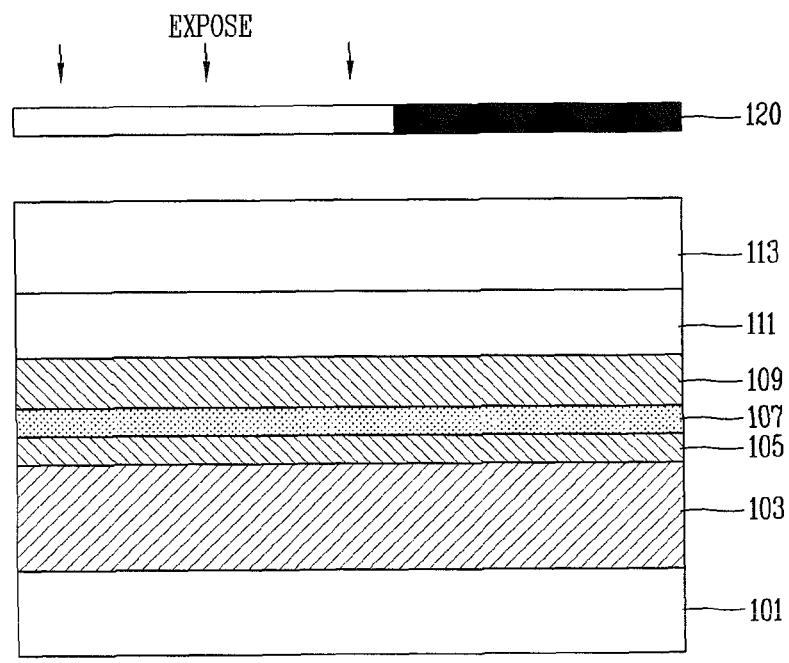
FIGS. 2A through 2I illustrate cross-sectional views of an example of fabricating an MIM capacitor.

Then, as illustrated in FIG. 2A, a metal wiring layer 103 and a first metal layer 105 for a lower electrode may be sequentially deposited on the pre-metal insulation layer (not shown). A thickness of the metal wiring layer 103 may be changed according to an Rs (resistance) value required for the wiring process. The metal wiring layer 103 may include aluminum (Al), copper, and the like. In one general aspect, the metal wiring layer 103 includes AlCu.

The first metal layer 105 may include a metal, an alloy or a conductive metal compound. For example, the first metal layer 105 may be at least any one selected from a group consisting of Ti, TaN, WN, TiN, TiAlN, or a combination of any thereof In one general aspect, the first metal layer 105 includes a TiN (top)/Ti (bottom) layer.

Subsequently, a dielectric layer 107 may be deposited on the first metal layer 105. The dielectric layer 107 may be formed using an atomic layer deposition (ALD) process, a sputtering process, a pulsed laser deposition process, an electron-beam deposition process, or a chemical vapor deposition process. In one general aspect, ALD is used to form a repeated structure of high-k $HfO_2/Al_2O_3$ film stacks.

Though it will be described later, if insulation material having a high-dielectric-constant value remains in the via-opening region on the first metal layer 105, a problem may arise during an etching process for forming a via opening. However, with respect to silicon nitride (SiN), a problem may not arise because the silicon nitride is easily etched when forming a via opening, even when it continues to remain sideward on the first metal layer 105.

The thickness of SiN may be reduced to increase the capacitance of a capacitor. If the thickness of SiN is reduced, a leakage current may be caused. Thus, a material having a high-dielectric-constant value is preferably used if the thickness is same. On the other hand, subsequent to forming the dielectric layer 107, a heat treatment process, an ozone treatment process, an oxygen treatment process, a plasma annealing process and the like may be additionally performed for the dielectric layer 107 to improve the electrical characteristic of the dielectric layer 107.

The dielectric layer 107 may include a first region and a second region. The first region may be an etched region in which part of the thickness is etched during the subsequent process. The second region may be an as-grown region that is used as a dielectric substance of the MIM capacitor while being a non-etched region.

Next, a second metal layer 109 to be used as an upper electrode may be deposited on the dielectric layer 107. The second metal layer 109 may be formed using a metal, an alloy or a conductive metal compound. For example, the second metal layer 109 may be at least any one selected from a group consisting of W, Al, Cu, Ti, TaN, WN, TiN, TiAlN, or a combination of any thereof. In one general aspect, the second metal layer 109 includes TiN.

Subsequently, a hardmask insulator 111 may be deposited on the second metal layer 109 to obtain a sufficient height of a sidewall spacer that is to be formed at a side of an upper electrode. The height of the yet-to-be-formed upper electrode may be too small to define a sidewall spacer at the side of the upper electrode. Therefore, the hardmask insulator 111 is needed to make the sidewall spacer to be formed at the side of a hard mask and the yet-to-be-formed upper electrode. The hardmask insulator 111 may be deposited at a deposition thickness in a range of about 100 Å to 4000 Å.

Figure 2B:
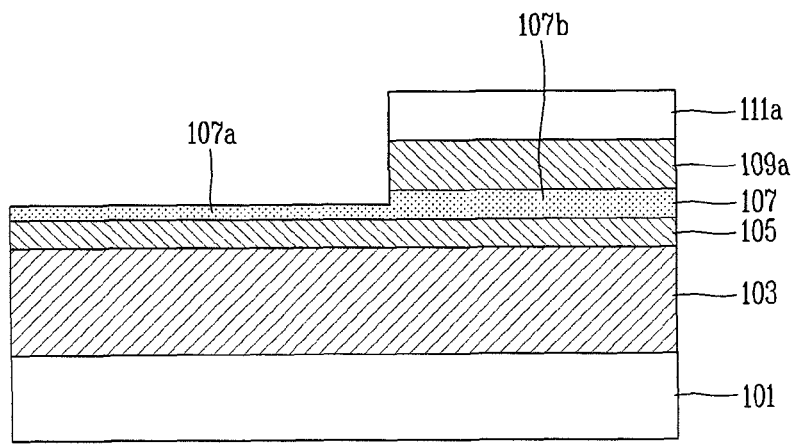

Next, a photoresist (PR) layer 113 may be coated on the hardmask insulator 111 and then patterned to form a first PR mask. Subsequently, as illustrated in FIG. 2B, the hardmask 111a and the upper electrode 109a may be patterned using the same mask so that they have a same shape. Etching may be stopped at the dielectric layer 107 not to expose the first metal layer 105 to the outside. If the first metal layer 105 is exposed when etching the hardmask insulator 111 and the second metal layer 109, metal polymer is generated, thereby causing leakage current.

Since overetching may be performed to etch the upper electrode 109a, the thickness of the dielectric layer 107 in the etched dielectric region 107a may be formed to be less than at least a thickness of the dielectric layer 107 in the as-grown dielectric region 107b. Here, the layer thickness of the remaining dielectric layer 107 in the etched dielectric region 107a may be in a range of about 100 Å to 4000 Å. Furthermore, the thickness of the remaining dielectric layer 107 in the etched dielectric region 107a may be controlled to enhance process margin. When performing an etching process using the first photoresist layer pattern 113a as a mask layer, a gas of $CF_4/CH_xF_y/O_2/N_2/Ar$ or the like may be used in etching the hardmask insulator 111, $Cl_2/BCl_3$ may be used in etching the second metal layer 109 for an upper electrode of the MIM capacitor, and $N_2$, Ar, or the like are used as an additive gas for etch profile control.

Figure 2C:
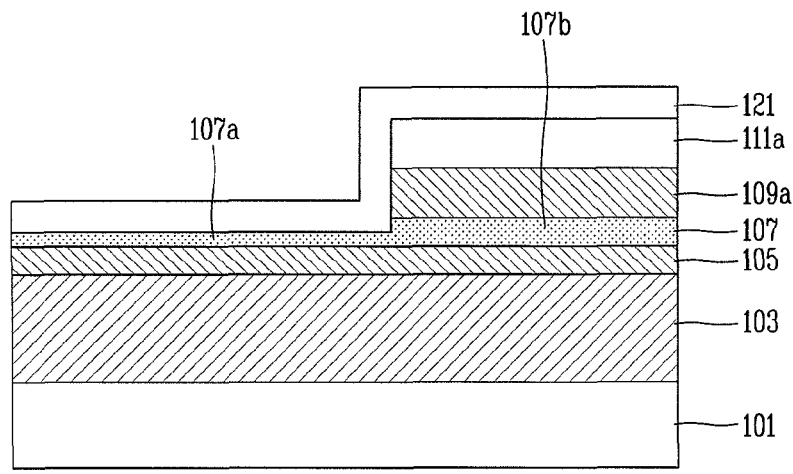

Next, as illustrated in FIG. 2C, a spacer insulator 121 may be deposited as an insulating film such that it covers an upper surface and a side surface of the hardmask 111a, a side surface of the upper electrode 109a, and an exposed surface of the dielectric layer 107. The spacer insulator 121 may have a deposition thickness in a range of about 100 Å to 4000 Å. The spacer insulator 121 may use the same material as a deposition material of the hardmask insulator 111, which remains adhesion problem between the spacer insulator 121 and the hardmask insulator 111.

Figure 2D:
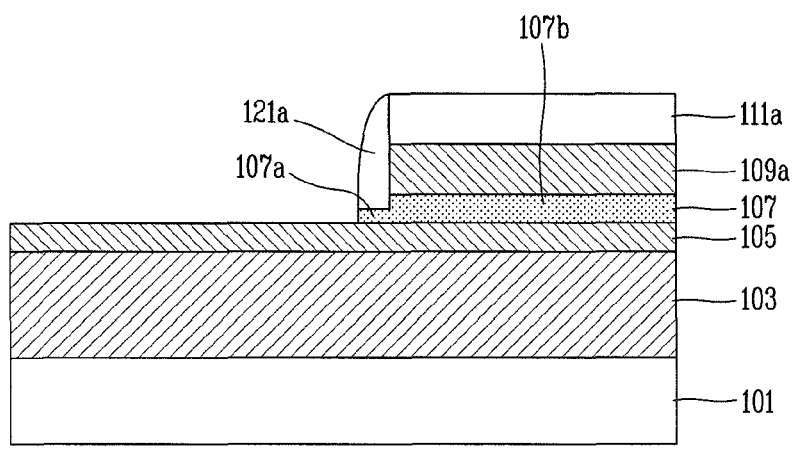

Subsequently, as illustrated in FIG. 2D, exposed portions of the dielectric layer 107 and the spacer insulator 121 may be etched back until the first metal layer 105 is exposed. In addition, a spacer 121a may be formed on the side surface of both the hardmask 111a and the upper electrode 109a, and surfaces of the etched dielectric region 107a and the curved dielectric region 107c. Using an over etching process, the dielectric region 107 remaining at a via opening region may be completely removed. If the etched dielectric region 107a is not completely removed, then the remaining portion of the etched dielectric region 107a may act as an etching stopper in the subsequent etching process for forming a via opening, thereby obstructing the forming of a via opening.

As a result, through the process of forming a spacer 121a, a horizontal length (or width) of the dielectric layer 107 may be formed to be greater than a horizontal length (or width) of the upper electrode 109a formed on the dielectric layer 107. The upper electrode 109a may be well separated from the lower electrode 105a by forming the dielectric layer 107 more broadly than the upper electrode 109a, thereby helping to suppress the generation of leakage current.

On the other hand, the hardmask 111a may be slightly lost in the process of etching the spacer insulator 121. This may be due to the material of the hardmask 111a being the same as the material of the spacer insulator 121. An exposed upper portion of the first metal layer 105 may be slightly lost in the process of etching the spacer insulator 121. This may be due to the over-etching of the first metal layer 105 to ensure only a side surface of the spacer insulator 121 remains.

When the process of forming the spacer 121a is finished in this manner, the MIM capacitor 400 may be completely separated from an external environment. As a result, the spacer 121a may perform the role of protecting a side surface of the upper electrode 109a together with the hardmask 111a. The etched dielectric region 107a may exist under the spacer 121a, and the first metal layer 105 for a lower electrode 105a may exist under the etched dielectric region 107a. In one general aspect, the thickness of the etched dielectric region 107a existing under the spacer 121a may be less than a thickness of the as-grown dielectric region 107b. The upper electrode 109a, the curved dielectric region 107c, and the hardmask 111a may be in contact with a side surface of the spacer 121a.

Figure 2E:
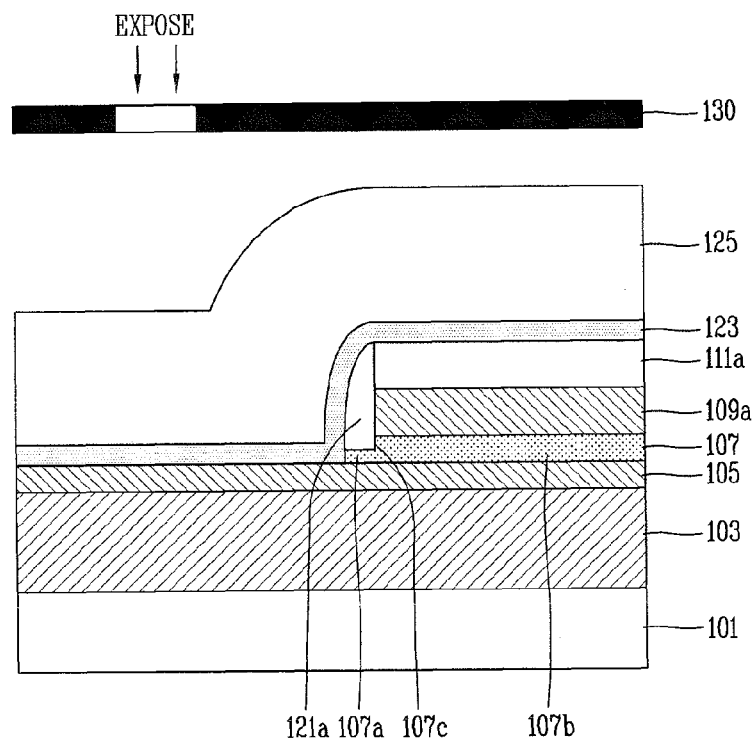

Subsequently, as illustrated in FIG. 2E, the buffer insulation layer 123 with a nitride-based material such as SiON may be deposited as an anti-reflection layer, such that it covers an upper surface of the hardmask 111a, a side surface of the spacer 121a, a side surface of the etched dielectric region 107a, and an exposed surface of the first metal layer 105. The buffer insulation layer 123 has a different etching rate from the material used in the spacer insulator 121 or the hardmask 111a. The buffer insulation layer 123 may induce an etch stop for the first time on the buffer insulator when forming a via hole.

In one general aspect, the buffer insulation layer 123 may be formed by using SiON. The SiON may perform the role of an antireflection layer for increasing the margin of a lithography process during the subsequent metal patterning. Furthermore, the buffer insulation layer 123 may simultaneously perform the role of a buffer layer for buffering a via etch target. In one general aspect, the thickness of the buffer insulation layer 123 may be deposited in a range of about 50 Å to 1000 Å.

Since the buffer insulation layer 123 may be deposited on an entire surface of the substrate 101, the buffer insulation layer 123 may be in direct contact with the first metal layer 105 for a lower electrode 105a exposed to the outside. However, the buffer insulation layer 123 does not contact with upper electrode 109a, because the side surface and the upper surface of the upper electrode 109a may be enclosed with the spacer 121a and the hard mask 111a, respectively.

Furthermore, SiON, which is used for the buffer insulation layer 123, may be deposited by using $SiH_4/N_2O$ gas in the temperature range of 350° C. to 420° C. In consideration of a margin of a photolithography process, the value of n (refractive index) and k (extinction coefficient) may be changed to be 1.8-22 and 0.30-0.45, respectively. The values n and k may be changed by controlling the gas ratio of $SiH_4/N_2O$. The values n and k may be increased as the gas ratio of $SiH_4/N_2O$ is decreased, thereby serving to increasing the fraction of $N_2O$.

Moreover, the neighboring photoresist (PR) layer may be dissolved due to diffused reflection if the reflectance is high, thereby causing difficulty to control photo DI critical dimension (CD). Organic BARC may be used for the buffer insulation layer 123, instead of inorganic SiON.

In addition, when the via over-etch target is less than about 5000 Å, SiON may be deposited with a relatively low thickness in the range of about 50 Å to 400 Å to secure the margin of a lithography process and use it as an antireflection layer for fine patterning.

However, when the via over-etch target is greater than about 5000 Å, SiON is deposited with a thickness in the range of about 400 Å to 1000 Å. Furthermore, when etching to form a via, an etching selectivity of oxide layer to SiON is increased by using gas-chemical properties having a high C/F ratio such as $C_4F_8$, $C_5F_8$, $C_4F_6$, and the like. SiON performs the role of an antireflection layer for fine patterning while at the same time performing the role of a buffer layer for buffering a via etch target.

In addition, the buffer insulation layer 123 may be also used as a hardmask layer for etching the metal wiring layer 103 and first metal layer 105. However, only PR mask may not be enough to etch both the metal wiring layer 103 and the first metal layer 105. Here, the thickness of the buffer insulation layer 123 may be in the range of about 100 Å to 500 Å.

Next, a second photoresist layer 125 may be coated on the buffer insulation layer 123, and exposed and developed by a photolithography process using a second mask 130, and then patterned to form a second PR mask.

Figure 2F:
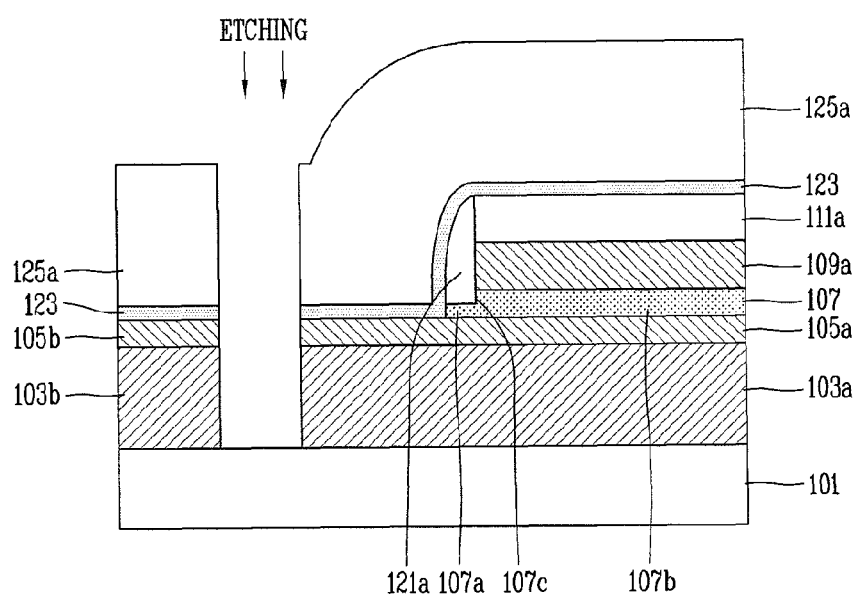

Subsequently, as illustrated in FIG. 2F, the buffer insulation layer 123 may be etched by using the second PR mask. Furthermore, the buffer insulation layer 123 may be etched by using $CHF_3$, $CF_4$, and $CH_2F_2$ gas in a single or mixed manner. A gas such as $N_2$, $O_2$, Ar and the like may be added to control the etch rate or the cross-sectional profile.

Next, the substrate 101 may be placed on a metal etching device. Then, the first metal layer 105 and metal wiring layer 103 are sequentially etched to form a metal wiring 103a and a lower interconnection metal layer 103b, a lower electrode 105a, and a lower interconnection capping layer 105b using the second PR mask and the buffer insulation layer 123, thereby completing the process of forming the MIM capacitor 400. When the metal wiring layer 103 is etched without the second PR mask, the spacer 121a may be etched. To protect the spacer 121a, the second PR mask covers the spacer 121a. Furthermore, $Cl_2$ or $BCl_3$ may be used in a single manner when etching the first metal layer 105 and metal wiring layer 103, and a gas such as $N_2$, $C_2H_4$, $CH_4$, $CHF_3$, Ar or the like may be used to implement the cross-sectional profile.

Figure 2G:
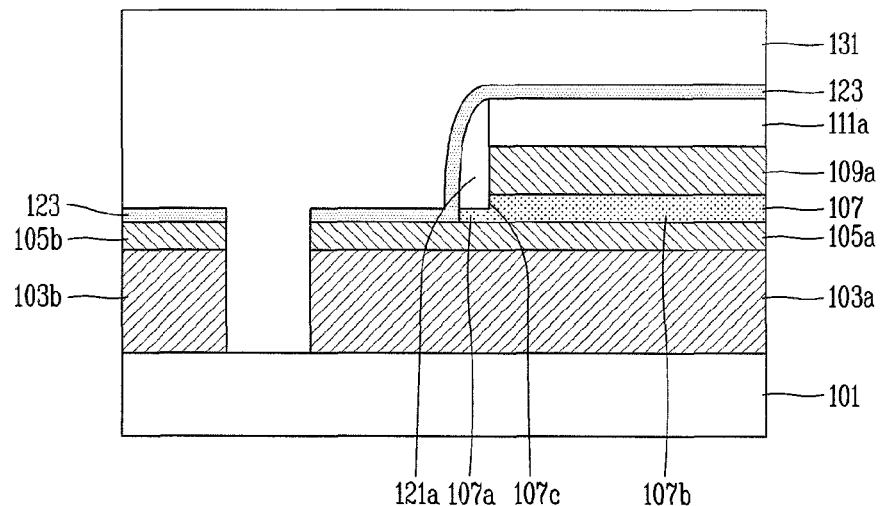

Next, as illustrated in FIG. 2G, to fill the area between the metal wiring 103a and the lower interconnection metal layer 103b, the intermetal insulation layer 131 may be deposited. A chemical-mechanical planarization (CMP) process may be performed to planarize the intermetal insulation layer 131.

Figure 2H:
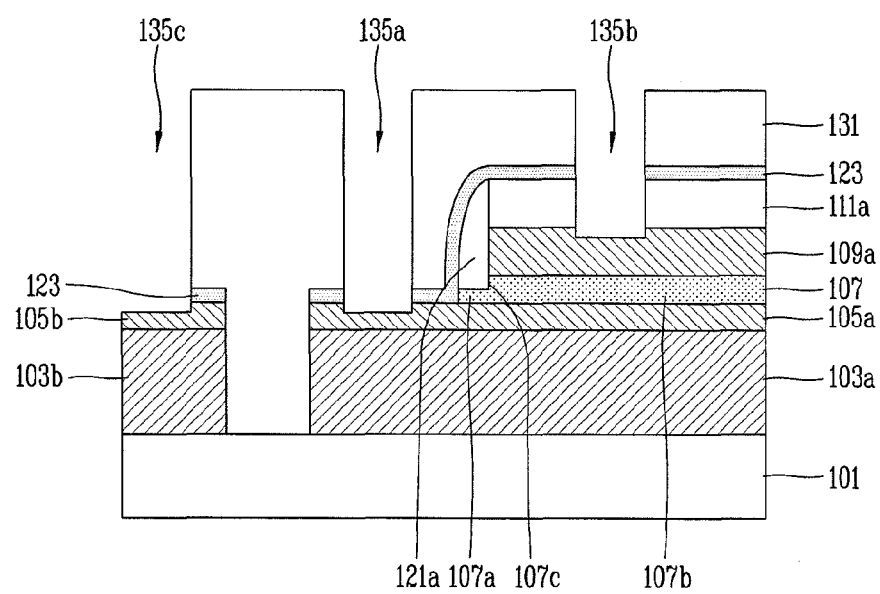

Next, as illustrated in FIG. 2H, via openings 135a, 135b, and 135c may be simultaneously formed to connect the upper electrode 109a and lower electrode 105a, respectively. If the etched dielectric region 107a having a high-dielectric constant remains when forming the via opening for forming the lower electrode 105a, it may act as an etch barrier, resulting in an opening failure. However, an opening failure may be prevented because the etched dielectric region 107a is completely removed previously, for example, in FIG. 2D.

Figure 2I:
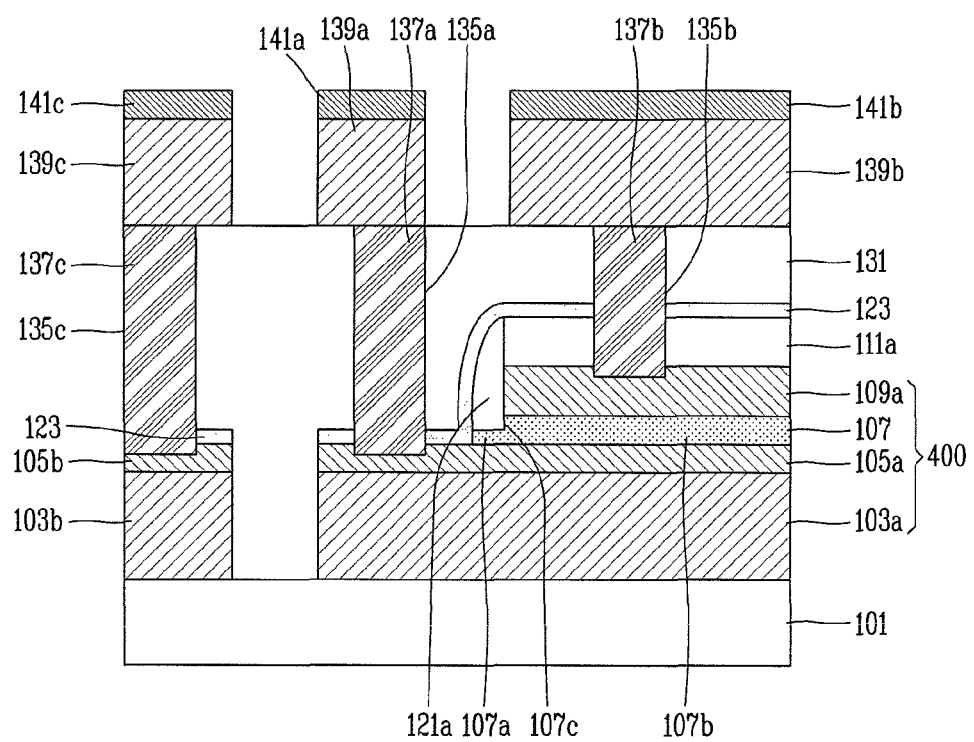

Subsequently, as illustrated in FIG. 2I, the metal plugs 137a, 137b and 137c are connected to the lower electrode 105a, the upper electrode 109a, and the lower interconnection capping layer 105b, respectively. In one general aspect, tungsten (W) may be used for the metal plugs. A first and a second pad 139a, 139b, and an upper interconnection metal layer 139c may be formed over the metal plug 137a, 137b and 137c, respectively, thereby completing a wiring forming process.

As described above, an MIM capacitor may be isolated from an external environment and protected from various defects, thereby securing a good leakage current characteristic. In addition, SiON deposited on an upper portion of the metal layer may buffer an etch target during etching, thereby preventing the breakdown voltage characteristic deterioration of an MIM capacitor.

Moreover, a horizontal length (or width) of the lower electrode may be greater than that of an upper electrode. The upper electrode may be well separated from the lower electrode by forming the horizontal length of the dielectric layer more broadly than the upper electrode, thereby helping to suppress the generation of leakage. Because of implementing a method of fabricating an MIM capacitor according to above-referenced general aspects, it may be possible to have an excellent reliability with respect to breakdown voltage, defect density and the like.

The terms including such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of the following claims.

It should be noted that the terms used herein not to limit but to describe general aspects. Incidentally, unless clearly used otherwise, expressions in the singular number include a plural meaning In this application, the term "comprising," "including," or the like, intend to express the existence of the characteristic, the numeral, the step, the operation, the element, the part, or the combination thereof, and do not intend to exclude another characteristic, numeral, step, operation, element, part, or any combination thereof, or any addition thereto.

Unless defined otherwise, the terms used herein including technological or scientific terms have the same meaning that is generally understood by those ordinarily skilled in the art. The terms used herein shall not be interpreted not only based on the definition of any dictionary but also the meaning that is used in the field. In addition, unless clearly defined, the terms used herein shall not be interpreted too ideally or formally.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device, comprising:
a lower electrode on a substrate;
a dielectric layer on the lower electrode, the dielectric layer comprising a first dielectric region and a second dielectric region;
an upper electrode on the second dielectric region;
a hardmask on the upper electrode, the hardmask comprising one or more substances selected from the group consisting of borophosphosilicate glass (BPSG), phosphosilicate glass (PSG), undoped silicate glass (USG), silicon-on-glass (SOG), field oxide (FOX), tetraethyl orthosilicate (TEOS), plasma TEOS (PE-TEOS), high density plasma oxide, silicon nitride (SiN), and silicon oxynitride (SiON);
a spacer at a side surface of the hardmask and the upper electrode and over the first dielectric region; and
a buffer insulation layer on the hardmask and the spacer.

2. The semiconductor device of claim 1, wherein the dielectric layer comprises high-k $HfO_2/Al_2O_3$ film stacks.

3. The semiconductor device of claim 1, wherein the hardmask and the upper electrode have a same shape.

4. The semiconductor device of claim 1, wherein the spacer isolates the side surface of the hardmask and the upper electrode.

5. The semiconductor device of claim 1, wherein the second dielectric region separates the lower electrode from the upper electrode.

6. The semiconductor device of claim 1, wherein a length of the lower electrode is greater than a length of the upper electrode.

7. The semiconductor device of claim 6, wherein:
the lower electrode comprises TiN/Ti; and
the upper electrode comprises TiN.

8. The semiconductor device of claim 1, wherein the first dielectric region extends from the second dielectric region and terminates approximately at an end of the spacer, the end of the spacer being on an opposite side of the spacer from a side of the spacer contacting the side surface of the hardmask and the upper electrode, and
wherein a thickness of the first dielectric region is less than a thickness of the second dielectric region.

9. The semiconductor device of claim 8, wherein the end of the spacer is defined by the buffer insulation layer and the first dielectric region.

10. The semiconductor device of claim 1, further comprising:
a curved dielectric region between the second dielectric region and the first dielectric region.

11. The semiconductor device of claim 10, wherein the spacer is over the curved dielectric region.

12. The semiconductor device of claim 10, wherein the first dielectric region extends from the curved dielectric region and terminates approximately at an end of the spacer, the end of the spacer being on an opposite side of the spacer from a side of the spacer contacting the side surface of the hardmask and the upper electrode,
wherein the curved dielectric region is configured to connect the first dielectric region and the second dielectric region, and
wherein a thickness of the first dielectric region is less than a thickness of the second dielectric region and the curved dielectric region.

13. The semiconductor device of claim 1, wherein the buffer insulation layer comprises SiON.

14. A semiconductor device, comprising:
a lower electrode on a substrate;
a dielectric layer on the lower electrode, the dielectric layer comprising a first dielectric region, a second dielectric region, and a curved dielectric region between the second dielectric region and the first dielectric region;
an upper electrode on the second dielectric region;
a hardmask on the upper electrode;
a spacer at a side surface of the hardmask and the upper electrode and over the first dielectric region; and
a buffer insulation layer on the hardmask and the spacer.

15. The semiconductor device of claim 14, wherein the spacer is over the curved dielectric region.

16. The semiconductor device of claim 14, wherein the first dielectric region extends from the curved dielectric region and terminates approximately at an end of the spacer, the end of the spacer being on an opposite side of the spacer from a side of the spacer contacting the side surface of the hardmask and the upper electrode,
wherein the curved dielectric region is configured to connect the first dielectric region and the second dielectric region, and
wherein a thickness of the first dielectric region is less than a thickness of the second dielectric region and the curved dielectric region.

* * * * *